United States Patent [19]
Pollock et al.

[11] Patent Number: 5,188,971
[45] Date of Patent: Feb. 23, 1993

[54] PROCESS FOR MAKING A SELF-ALIGNED BIPOLAR SINKER STRUCTURE

[75] Inventors: Larry J. Pollock; Atiye Bayman, both of Palo Alto, Calif.

[73] Assignee: Synergy Semiconductor Corporation, Santa Clara, Calif.

[21] Appl. No.: 635,684

[22] Filed: Dec. 27, 1990

Related U.S. Application Data

[63] Continuation of Ser. No. 291,185, Dec. 28, 1988, Pat. No. 5,001,538.

[51] Int. Cl.$^5$ .......................................... H01L 21/265
[52] U.S. Cl. ...................................... 437/31; 437/65; 437/67
[58] Field of Search ..................... 357/41; 437/31, 65, 437/67, 33

[56] References Cited

U.S. PATENT DOCUMENTS

| | | | |
|---|---|---|---|
| 4,704,368 | 11/1987 | Goth et al. | 437/31 |
| 4,711,017 | 12/1987 | Lammert | 437/67 |
| 4,717,682 | 1/1988 | Taka et al. | 437/67 |
| 4,829,015 | 5/1989 | Schaber et al. | 437/31 |
| 4,871,685 | 10/1989 | Taka et al. | 437/31 |
| 5,008,208 | 4/1991 | Liu et al. | 437/31 |
| 5,036,021 | 7/1991 | Goto | 437/67 |

*Primary Examiner*—Brian E. Hearn
*Assistant Examiner*—Tuan Nguyen
*Attorney, Agent, or Firm*—Flehr, Hohbach, Test, Albritton & Herbert

[57] ABSTRACT

Bipolar devices on a common substrate are formed in tubs defined by a sinker that is self-aligning with the isolating trench and provides a relatively low vertical resistance contact from a surface contact to the underlying buried layer. In a first embodiment, the isolating trench initially is defined only down to the top surface of the buried layer. The trench walls are then doped, and the dopant allowed to diffuse laterally through the trench sidewalls. The resultant sinker is self-aligned with the isolating trench. The trench depth is then further increased to a desired depth preferably penetrating into the substrate. Thereafter, a bipolar device is formed in the tub, preferably with the device collector adjacent the trench and thus aligned with the sinker. In a second embodiment, an opening is formed in the surface oxide defining the area where the trench (when formed) will be cut. The opening is then used to diffuse dopant into the sinker, the dopant diffusing downward through the epitaxial layer to the buried layer, and also diffusing somewhat laterally. The trench is then cut in a single step through the epitaxial layer and the buried layer and into the underlying substrate, cutting directly through the region in which the sinker has been previously diffused. However, because of the lateral sinker diffusion, a portion of the heavily doped region (e.g., the sinker) remains, and is self-aligned with the edges of the tub defining trench.

23 Claims, 4 Drawing Sheets

PROCESS FOR MAKING A SELF-ALIGNED BIPOLAR SINKER STRUCTURE

This is a continuation of application Ser. No. 07/291,185 filed Dec. 28, 1988, now U.S. Pat. No. 5,001,538.

FIELD OF THE INVENTION

The present invention is related to high performance bipolar devices and more particularly a low resistance connection from the wafer surface to the buried layer, often referred to as a "sinker" in a bipolar device structure and a process for forming that sinker.

CROSS-REFERENCE TO RELATED APPLICATIONS

The sinker and the process for forming it disclosed in this application are especially useful in the formation of devices of the type disclosed in U.S. application Ser. No. 142,032 filed Jan. 11, 1988, entitled HIGH SPEED BIPOLAR MEMORY assigned to the assignee of this invention and incorporated herein by reference. Details of a complete bipolar process in which this sinker and related process may be efficiently incorporated may be found in U.S. application Ser. No. 180,626 filed Apr. 11, 1988, entitled PROCESS FOR PRODUCING A HIGH PERFORMANCE BIPOLAR STRUCTURE, also assigned to the assignee of this invention and incorporated herein by reference.

BACKGROUND OF THE INVENTION

The present trend in semiconductor technology is toward large scale of integration of devices with very high speed and low power consumption performance. The parameters that are essential to such high performance bipolar transistors include the presence of low parasitic capacitances as realized by shallow vertical junctions and small horizontal geometries. In other words it is necessary to make the devices in the integrated circuit as small as possible in both the horizontal and vertical directions.

Most such high performance bipolar devices incorporate a sinker, that is a heavily doped region extending from the surface of the substrate through the top epitaxial layer down to the buried layer to provide a low resistivity connection from the N− collector of the epi-region to the low resistance N+ buried layer. The buried layer will thereafter provide the low resistance lateral contact which extends under the bipolar device. The purpose in any bipolar device is to minimize the collector resistance. In the above incorporated application, a cell design was disclosed which helped solve this problem by reducing the distance from emitter to collector to lower the lateral spacing and thereby the collector resistance.

However, it is still essential to minimize the vertical resistance from the surface of the substrate where the collector is diffused to the buried layer. If it were necessary to establish a path through the epitaxial layer to the buried layer, the overall resistance would be higher. Sinkers have been used in the past for this purpose but formed in a different way and forming a different structure, and having a different doping profile than in this invention.

The standard approach in the prior art is as shown in FIG. 1 wherein the collector and sinker are located in a region 2 separated by an oxide isolation 4 from the emitter and base generally indicated at 6 of the bipolar device. The sinker in such a structure is formed by cutting a hole in the oxide, doing a masking step and diffusing the N+ sinker 7 from the surface. The result is a sidewise diffusion as well as a deep diffusion, resulting in the devotion of considerable area (as illustrated in FIG. 1) to the collector and associated sinker.

As also shown in FIG. 1, the complete bipolar device is typically defined in a tub 8 edged by trenches 10, 12 which tub extends down through the epitaxial layer 14 and buried layer 16 to the substrate region 18. In the above incorporated applications, it was illustrated how to modify such a prior art approach to define the collector in the same tub as the emitter and base without the use of separating oxide regions. However, it is also desirable to efficiently incorporate a sinker in this structure to have an optimized bipolar device with minimum collector resistance.

SUMMARY OF THE INVENTION

To facilitate such a structure, as well as other approaches to reduced horizontal dimension bipolar devices, it is an objective of this invention to provide a self-aligned sinker which can be easily and efficiently aligned with the isolating trenches 10 and 12 which define the region wherein the bipolar device is located.

It is a further objective herein to provide a sinker region which has the necessary depth to extend through the epitaxial layer to the buried layer without using significant lateral space in the device, so that a very dense sinker which functions effectively to connect the collector to the buried layer is provided without significantly increasing the horizontal space which must be devoted to the bipolar device.

It is a further objective to incorporate a sinker in a bipolar device without a significant increase in process complexity.

These and other objectives are achieved in this invention by providing a sinker which is self-aligned with the oxide isolating trench which is used to define the tub in which the complete bipolar device is located. In a preferred approach to the process for forming the sinker of this invention, an initial definition of the isolating trench only cuts the trench down to the top surface of the buried layer. The walls of the trench are doped, and the sinker diffused laterally through the sidewalls of the trench so that a sinker that is self-aligned with the isolating trench is created from the surface of the epitaxial layer in which the remainder of the bipolar device has yet to be defined down and into the buried layer. The trench is then defined for the remainder of the desired depth down through the buried layer and into the substrate layer below the buried layer. Thereafter, the device is formed in the tub preferably with the collector adjacent the trench and thereby aligned with the sinker. By following this sequence, little additional diffusion of the sinker occurs during subsequent processing, whereby an effective sinker, aligned with the collector of the bipolar device, is achieved without additional masking steps.

In an alternative approach, a hole may be cut in the surface oxide to define the area where the trench will be cut, but cutting of the trench is preceded by a diffusion of the sinker through the same hole. The sinker diffuses downward through the epitaxial layer to the buried layer, and also diffuses laterally to extend somewhat beneath the oxide immediately adjacent the trench and beyond the region where the trench will be defined.

The trench is then cut in a single step through the epitaxial layer and the buried layer and into the underlying substrate, cutting directly through the region in which the sinker has been previously diffused. However, because of the lateral diffusion of the sinker, a portion of the heavily doped region which shall function as the sinker remains, now self-aligned with the edges of the tub defining trench.

As shown in the incorporated applications, the collector or dual collectors of the bipolar device are preferably placed immediately adjacent the isolating trench. Therefore, the collector may be only a shallow junction, but is inherently immediately self-aligned with the sinker, providing a low-resistance contact, aligned with the collector, from the collector through the sinker to the buried layer to minimize the collector resistance of the device.

Other features and advantages of the present invention will be understood from a review of the preferred embodiment of this invention which is described below with reference to the following figures.

BRIEF DESCRIPTION OF THE DRAWINGS

FIGS. 2A-2D illustrate a first approach to formation of a sinker aligned with an isolating trench in a bipolar process;

DESCRIPTION OF A PREFERRED EMBODIMENT

Figure 4A:
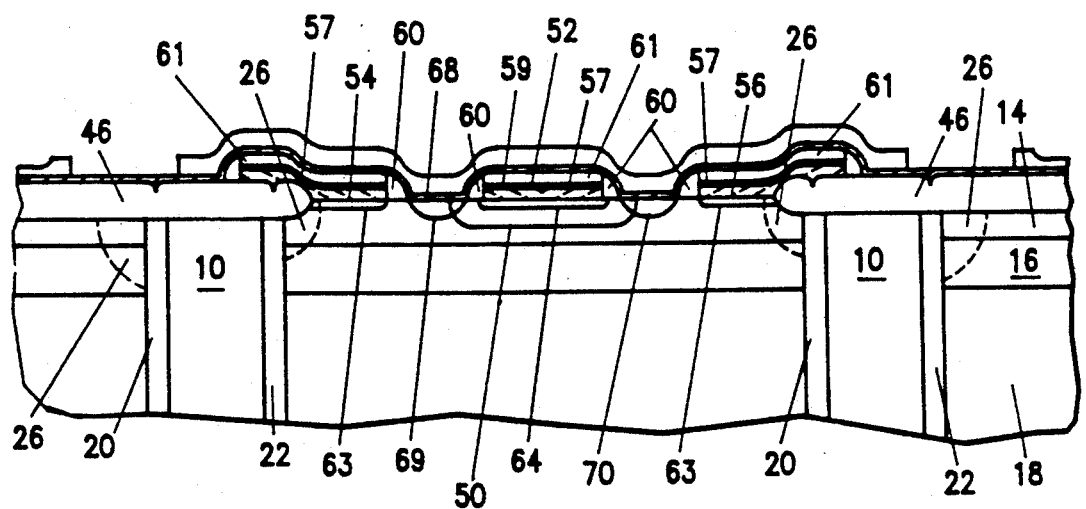
FIGS. 4A-4B illustrate a completed bipolar device showing the sinker aligned with the collector structure of the bipolar transistor.

The following description of preferred embodiment of the sinker and the processes for forming it is given with respect to FIGS. 2 and 4. In these figures, like regions will be identified by like reference numbers.

Figure 1:
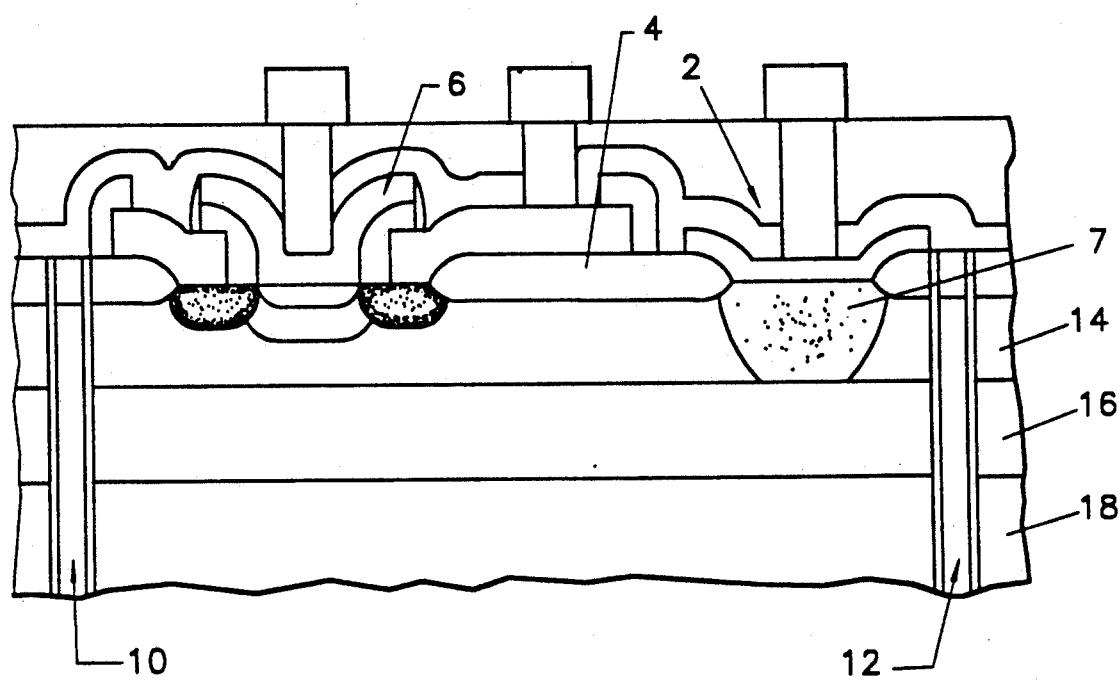
FIG. 1 illustrates a prior art process for sinker formation in a bipolar device process.
Figure 2A:
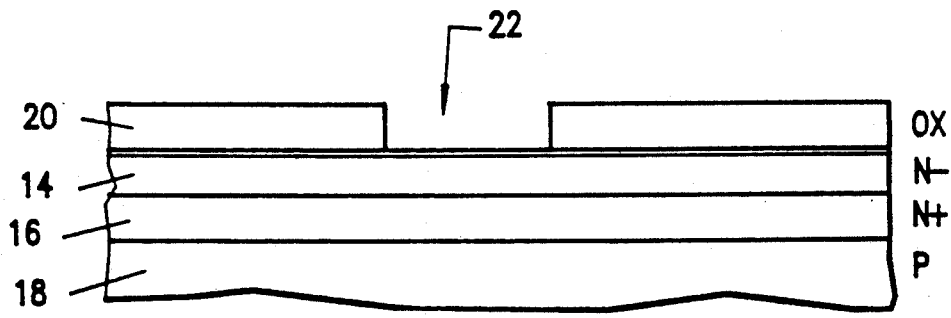

Referring first to FIG. 2A, the process begins with a substrate 18 on which a uniform, unmasked buried layer of an opposite polarity type to the substrate is formed. In devices of the preferred form of the process, the substrate will be P-type material, and the buried layer an N+ type material.

A uniform N− epitaxial layer 14 is then formed over the buried layer.

Next, as the first step (Step A) in defining the isolating trenches which will establish the region 8 where a bipolar transistor will be formed, an oxide layer 20 is grown over the surface of the epitaxial layer. As is well known in this technology, a layer of nitride (not shown in FIG. 2A) may be placed under the oxide to form the necessary stack so that selective etching of the nitride layers below this oxide to define the active device areas. A masking step is then used to define an opening 22 where the trench 10, 12 will be established.

Figure 2B:
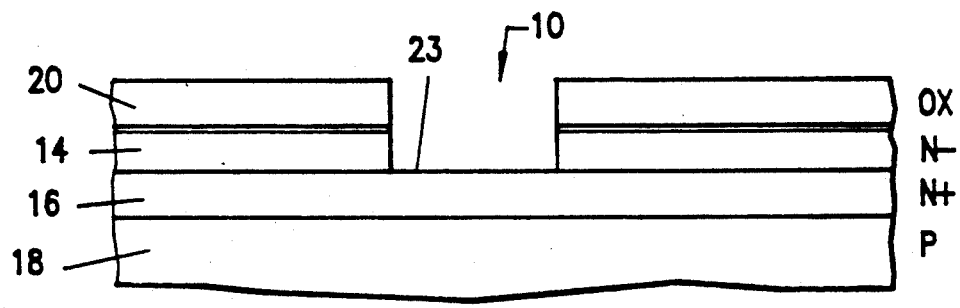

At Step B shown in FIG. 2B, by differential etching of a type which is well known in this technology, an anisotropic etch is performed down through the layer 14, stopping at just below the surface 23 of the buried layer 16. This anisotropic etch should be of the width of the desired finished isolating trench 10.

Figure 2C:
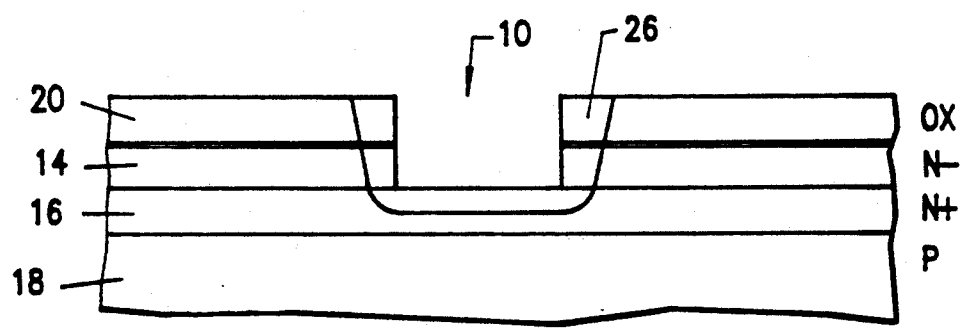
Figure 2C:
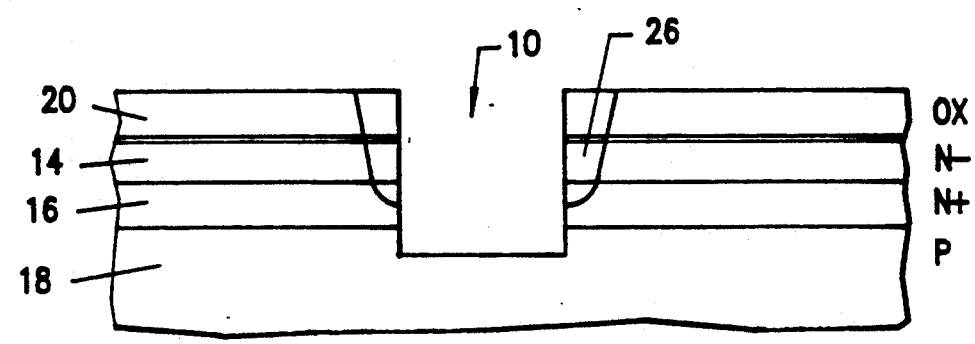

At Step C shown in FIG. 2C, the walls of this slot of trench 10 are then doped down to the buried layer 16. For example, they may be filled with an N+ doped polysilicon or doped glass. The critical feature is to dope the sidewalls of the trench. A heating step is then performed to cause the dopant, which is of the same conductivity type as the buried layer 16 and epitaxial layer 14, to diffuse out into the layers 16 and 14, forming what will become the sinker 26 immediately adjacent the trench. The dopant extends down to the buried layer 16.

The trench 10 is then cut the rest of the way through the layer 16 and down into the substrate 18 as shown in FIG. 2D. Finally, the oxide layer 20 is removed, and the processing to define the bipolar device structure as disclosed in the incorporated application is begun. All of the above steps can be accomplished without the aid of additional masking steps beyond those used to form the device shown in the incorporated application.

As is clearly apparent from the FIG. 2D, the sinker 26 has now been defined comprising a high conductivity region extending down through and into the buried layer, but no lower, aligned with the isolating trench 10, but occupying a minimum horizontal region and without additional masking steps.

Figure 3A:
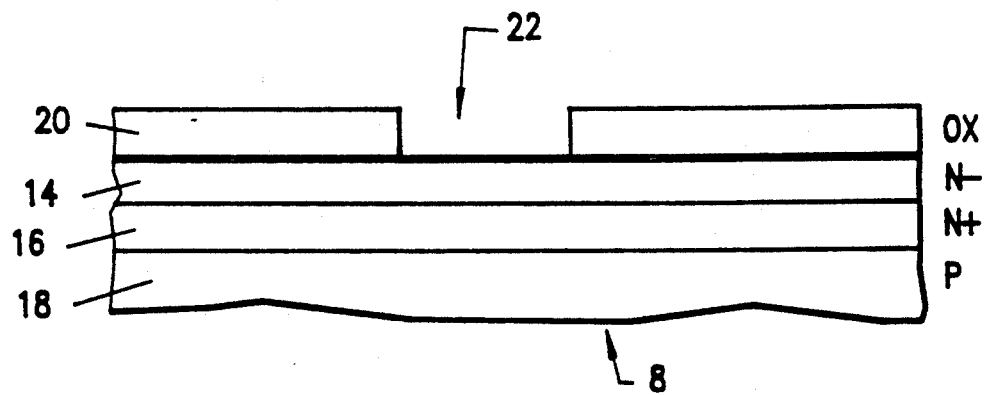
FIGS. 3A-3C illustrate an alternative approach to formation of a sinker aligned with the isolating trench.
Figure 3B:
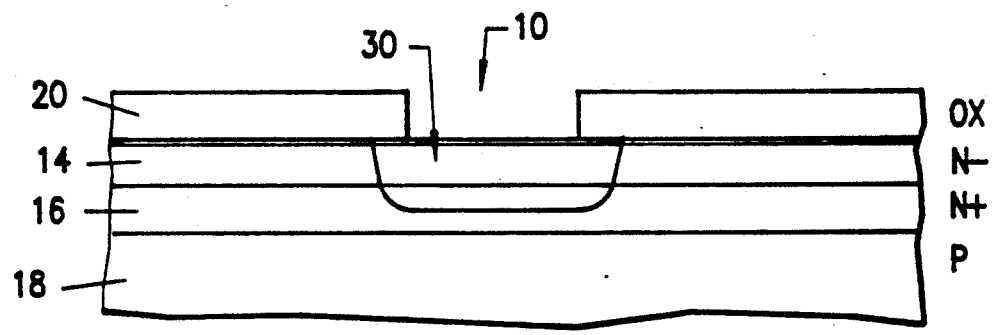
Figure 3C:
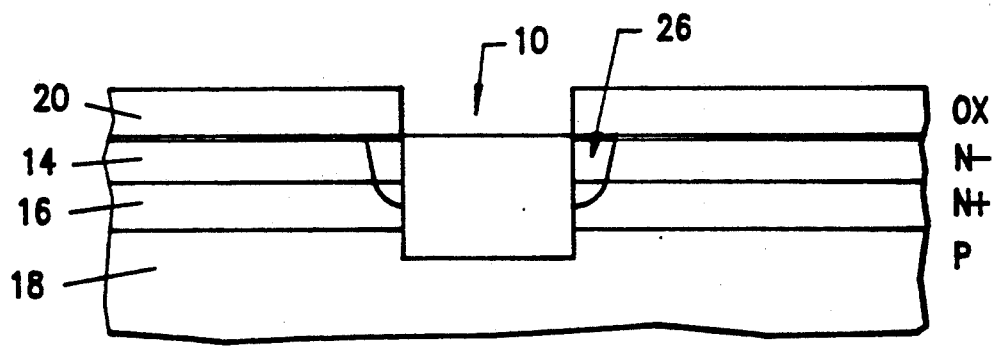

An alternative approach shown in FIG. 3, begins following completion of the step shown in FIG. 3A of defining the hole 22 in the oxide 20 defined by the trench isolation mask. This hole is first used as a masked opening for a diffusion to create a diffused region 30 which extends at least through the epitaxial layer 14 into the buried layer 16. Since the diffusion will be both vertical and lateral, although the dopant is introduced through the opening which will be used to define the trench, a portion of the dopant will extend and diffuse sideways beneath the oxide, extending laterally beyond the region where the trench 10 will be cut. Thereafter, in a single step, the trench 10 is cut through the layers 14 and 16 into the substrate 18. Because of the sideways diffusion discussed above, a sinker 26 inherently self-aligned with the isolating trench 10 has been created without additional masking.

It is immediately apparent from a review of FIG. 4 how the formation of the sinker 26 fits in with the formation of the bipolar device as formed in accordance with the reference application without additional masking steps, and with the collectors of the finished bipolar device being inherently and directly aligned with the sinker to provide a low resistance contact from collector to buried layer.

To briefly review the steps of the device formation process, already discussed in detail in the referenced application, the next masking step is to define the field oxide 46 which will surround the bipolar device and isolate it from adjoining devices, as well as providing a support layer for connections to be formed. After this step, the active base region 50 is formed and the N+ polysilicon layer (which will form contacts 52, 54, 56) is deposited. A thin silicide layer 57 is formed and topped with an oxide 61. The polysilicon emitter and collector contacts 50, 52, 54, 56 are then aligned and masked relative to the base 50. After this step, the spacers 60 are defined adjacent the emitter and collector. The subsequent heating steps will define the active collector 63 and emitter 64 by diffusion of the dopant from the poly 52, 54, 56 into the epitaxial layer 18. As can be seen, this diffusion step immediately brings the collector 63 into contact with the sinker 26 to provide the desired low resistance contact for the collector to the buried layer 16. The upper layer of P-doped poly 68 is then laid down and heating will define the extrinsic base regions 69 and 70, creating contact between the upper poly material and active intrinsic base 50 to complete formation of the device.

Figure 4B:
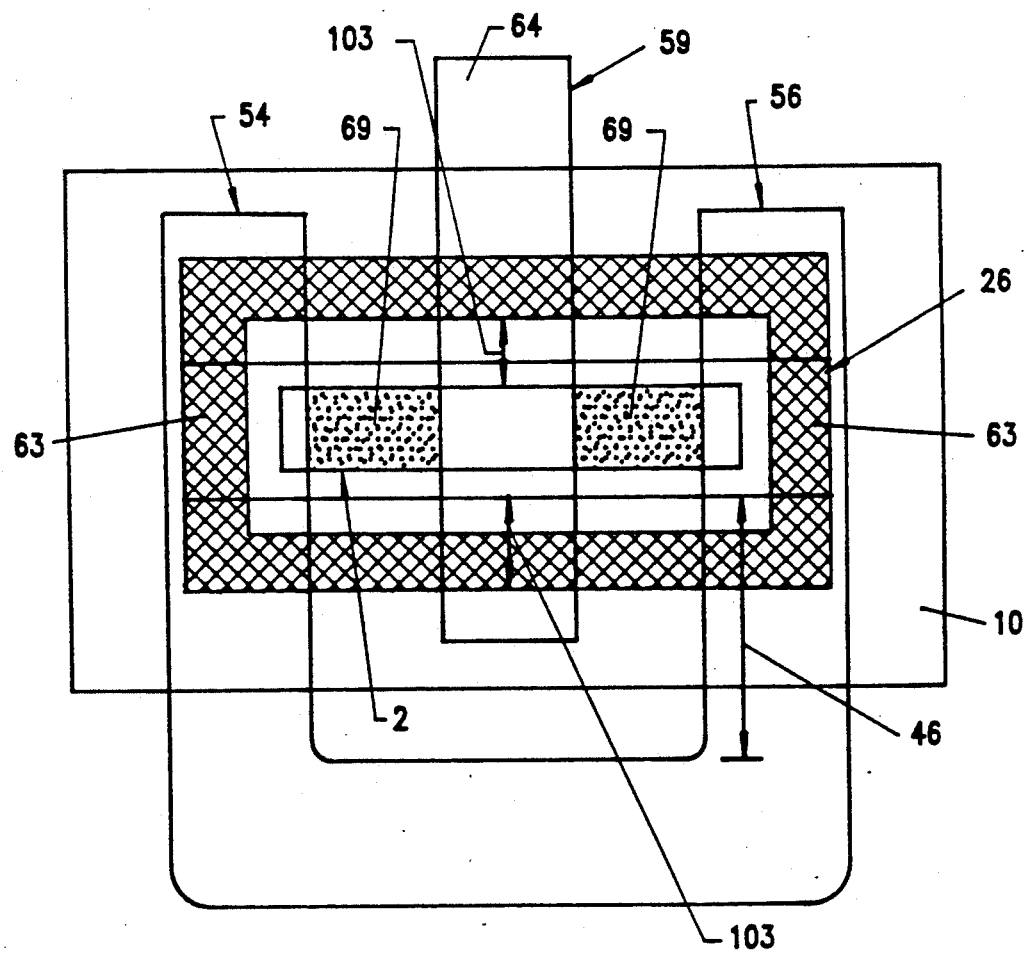

In summary, the above processes provide a self-aligned, horizontally limited, heavily doped sinker which provides an effective collector to buried layer low resistance contact. Because of the sequence of processing steps used herein, the sinker can be very accurately defined, and either placed or excluded as is necessary with additional masking to meet the requirements of different device structures, or if one wishes to limit sinker only to collector contact areas. For example, as shown in FIG. 4B, the sinker region 26 as seen in a top plan view is typically an annulus along the wall of the isolation trench 10 which surrounds the bipolar device shown in FIG. 4A. However, the region 26 can be masked to contact only a portion of the collector contact 63.

This sinker can be placed around the entire perimeter of all N− epi tubs without the use of additional masking steps (maskless sinker process). If the maskless sinker process is chosen, proper care must be taken in layout rule definition to allow sufficient space 103 for field oxide 46 to overlap the active area adjacent to base contacts 69 and 70, and emitters 64.

Alternative approaches to this invention may occur to a person of skill in the art who studies this disclosure. Therefore, the scope of this invention is to be limited only by the following claims.

What is claimed is:

1. The method of forming a sinker in a substrate supporting a plurality of bipolar devices in tubs in said substrate defined by isolation trenches, said substrate comprising a base layer of P-type material, a relatively thin buried layer of N-type material extending over the surface of said base layer, and an epitaxial layer of N-type material extending over the surface of said buried layer, said tubs for said devices being defined by said isolation trenches extending through said epitaxial layer and said buried layer to said substrate;
   the method for forming said sinker comprising the steps of:
   partially etching said isolation trench through said epitaxial layer down to said buried layer,
   doping the sidewalls of said isolation trench with a dopant of the same polarity as said buried layer, to form a conductive sinker from the surface of said substrate down to said buried layer,
   heating said doped sidewalls to diffuse said dopant into said substrate to form the sinker, and
   cutting said isolation trench down to said base layer to isolate said tubs including said buried layers one from another.

2. A process as in claim 1 wherein said partial trench etch prior to doping of said trench sidewalls is effected down to but stopping at a top surface of said buried layer.

3. A process as in claim 1 including the step of forming a layer of nitride and a layer of oxide over said epitaxial layer, an opening being defined in said nitride and oxide layer to establish the location of said trench, said trench being formed by differential etching of said oxide and said silicon.

4. A process as in claim 1 including the step of defining a collector of a bipolar transistor in said tub, said collector being adjacent said trench and substantially overlaying said sinker whereby a space efficient connection of said collector to said buried layer through said sinker is achieved.

5. A process as in claim 4 wherein said bipolar transistor includes a dual collector, said step of forming said bipolar transistor including defining said collectors adjacent said trenches and aligned with said sinkers to efficiently define a low resistance path between said collectors through said buried layer.

6. A process as in claim 5 wherein all of said bipolar transistor is defined in said tub.

7. The method of forming a sinker in a substrate supporting a plurality of bipolar devices in tubs in said substrate defined by isolation trenches, said substrate comprising a base layer of P-type material, a relatively thin buried layer of N-type material extending over the surface of said base layer, and an epitaxial layer of N-type material extending over the surface of said buried layer, said tubs for said devices being defined by said isolation trenches extending through said epitaxial layer and said buried layer to said substrate;
   the method for forming said sinker comprising the steps of:
   defining a doped region in said substrate of the same conductivity type as said buried layer extending from the surface of said substrate down to and into said buried layer,
   etching said isolation trench down through sinker and said buried layer and extending into said substrate to isolate said tubs including said buried layer one from another while provide said sinker self-aligned with said isolation trench.

8. A process as in claim 7 including the step of forming a layer of nitride and a layer of oxide over said epitaxial layer, an opening being defined in said nitride and oxide layer to establish the location of said trench, said trench being formed by differential etching of said oxide and said silicon.

9. A process as in claim 8 including the step of defining a collector of a bipolar transistor in said tub, said collector being adjacent said trench and substantially overlaying said sinker whereby a space efficient connection of said collector to said buried layer through said sinker is achieved.

10. A process as in claim 9 wherein said bipolar transistor includes a dual collector, said step of forming said bipolar transistor including defining said collectors adjacent said trenches and aligned with said sinkers to efficiently define a low resistance path between said collectors through said buried layer.

11. The method of forming a sinker self-aligned with isolating trenches defining device tubs in a substrate supporting a plurality of bipolar devices, said substrate comprising a base layer of P-type material, a buried layer of N-type material extending over the surface of said base layer, and an epitaxial layer of N-type material extending over the surface of said buried layer;
   said method comprising the steps of:
   defining a mask on said substrate, said mask having an opening over a region of said substrate,
   etching said substrate in the region of said mask opening through said epitaxial layer down to said buried layer to define an isolation trench having trench sidewalls and a trench bottom,
   doping said trench sidewalls of said isolation trench through said mask with a dopant of the same polarity as said N-type buried layer,
   heating said doped sidewalls to diffuse said dopant into said substrate to form a conductive sinker from the surface of said substrate down to said buried layer, and further etching said isolation trench down to said base layer to isolate said tubs including said buried layers one from another.

12. A process as in claim 11 wherein said trench etch prior to doping of said trench sidewalls is effected down to but stopping at a top surface of said buried layer.

13. A method as in claim 11 including the step of forming a layer of nitride and a layer of oxide over said epitaxial layer, an opening being defined in said nitride and oxide layer to establish the location of said trench, said trench being formed by differential etching of said oxide and said silicon.

14. A method as in claim 11 including the step of defining a collector of a bipolar transistor in said tub, said collector being adjacent said trench and substantially overlaying said sinker whereby a space efficient connection of said collector to said buried layer through said sinker is achieved.

15. A method as in claim 14 wherein said bipolar transistor includes a dual collector, said step of forming said bipolar transistor including defining said collectors adjacent said trenches and aligned with said sinkers to efficiently define a low resistance path between said collector through said buried layer.

16. A method as in claim 15 wherein all of said bipolar transistor is defined in said tub.

17. The method of forming a sinker self-aligned with isolating trenches defining tubs in a substrate supporting a plurality of bipolar devices, said substrate comprising a base layer of first-polarity material, a buried layer of opposite-polarity material extending over the surface of said base layer, and an epitaxial layer of same polarity material as said buried layer extending over the surface of said buried layer; said method comprising the steps of:

defining a mask on said substrate, said mask having an opening over a region of said substrate, defining a doped region in said substrate through said mask of the same conductivity type as said buried layer extending from the surface of said substrate down to and into said buried layer, etching said substrate in the region of said mask opening to form an isolating trench down through said epitaxial layer, said buried layer, and extending into said substrate, to isolate said tubs including said buried layer one from another while providing said sinker self-aligned with said isolating trench.

18. A process as in claim 17 including the step of forming a layer of nitride and a layer of oxide over said epitaxial layer, an opening being defined in said nitride and oxide layer to establish the location of said trench, said trench being formed by differential etching of said oxide and said silicon.

19. A process as in claim 18 including the step of defining a collector of a bipolar transistor in said tub, said collector being adjacent said trench and substantially overlaying said sinker whereby a space efficient connection of said collector to said buried layer through said sinker is achieved.

20. A process as in claim 19 wherein said bipolar transistor includes a dual collector, said step of forming said bipolar transistor including defining said collectors adjacent said trenches and aligned with said sinkers to efficiently define a low resistance path between said collectors through said buried layer.

21. The method of claim 17, wherein said base layer is P-type material, and said buried layer is N-type material.

22. The method of claim 17, wherein said step of defining a doped region includes the step of introducing a dopant through said opening in said mask, said dopant penetrating at least into an underlying region of said buried layer.

23. The method of claim 15, wherein said step of defining a doped region further includes the step of causing said dopant to penetrate at least laterally beyond a region subsequently traversed by said isolating trench.

* * * * *